United States Patent
Po

(10) Patent No.: US 9,633,734 B1
(45) Date of Patent: Apr. 25, 2017

(54) DRIVING CIRCUIT FOR NON-VOLATILE MEMORY

(71) Applicant: eMemory Technology Inc., Hsin-Chu (TW)

(72) Inventor: Chen-Hao Po, Hsinchu (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 0 days.

(21) Appl. No.: 15/348,369

(22) Filed: Nov. 10, 2016

Related U.S. Application Data

(60) Provisional application No. 62/362,068, filed on Jul. 14, 2016.

(51) Int. Cl.
  G11C 16/12 (2006.01)
  G11C 16/26 (2006.01)
  G11C 16/04 (2006.01)
(52) U.S. Cl.
  CPC .......... G11C 16/12 (2013.01); G11C 16/0433 (2013.01); G11C 16/26 (2013.01)
(58) Field of Classification Search
  CPC ..... G11C 16/12; G11C 16/26; G11C 16/0433; H03K 19/018521

USPC ........................................................ 327/333
See application file for complete search history.

(56) References Cited

U.S. PATENT DOCUMENTS

| | | | |
|---|---|---|---|
| 5,963,061 A * | 10/1999 | Briner | H03K 19/0185 327/215 |
| 6,487,687 B1 * | 11/2002 | Blake | H03K 3/356113 324/762.07 |
| 7,145,370 B2 | 12/2006 | Bernard et al. | |
| 7,580,311 B2 | 8/2009 | Pesavento | |
| 7,663,423 B1 * | 2/2010 | Cheng | H03K 3/356113 327/333 |
| 8,368,425 B2 * | 2/2013 | Huang | H03K 3/356182 326/68 |
| 8,373,485 B2 | 2/2013 | Po et al. | |
| 8,653,878 B2 * | 2/2014 | Po | H03K 19/0175 326/80 |
| 9,252,775 B2 | 2/2016 | Schrom et al. | |
| 9,461,648 B1 * | 10/2016 | Lee | H03K 19/00315 |

* cited by examiner

Primary Examiner — Douglas King
(74) Attorney, Agent, or Firm — WPAT, PC; Justin King

(57) ABSTRACT

A driving circuit includes a first driver, a switching circuit and a second driver. The first driver receives and input signal and an inverted input signal, and generates a driving signal. The switching circuit receives the driving signal and a first mode signal. Moreover, an output signal is outputted from an output terminal. The second driver is connected with the output terminal.

19 Claims, 4 Drawing Sheets

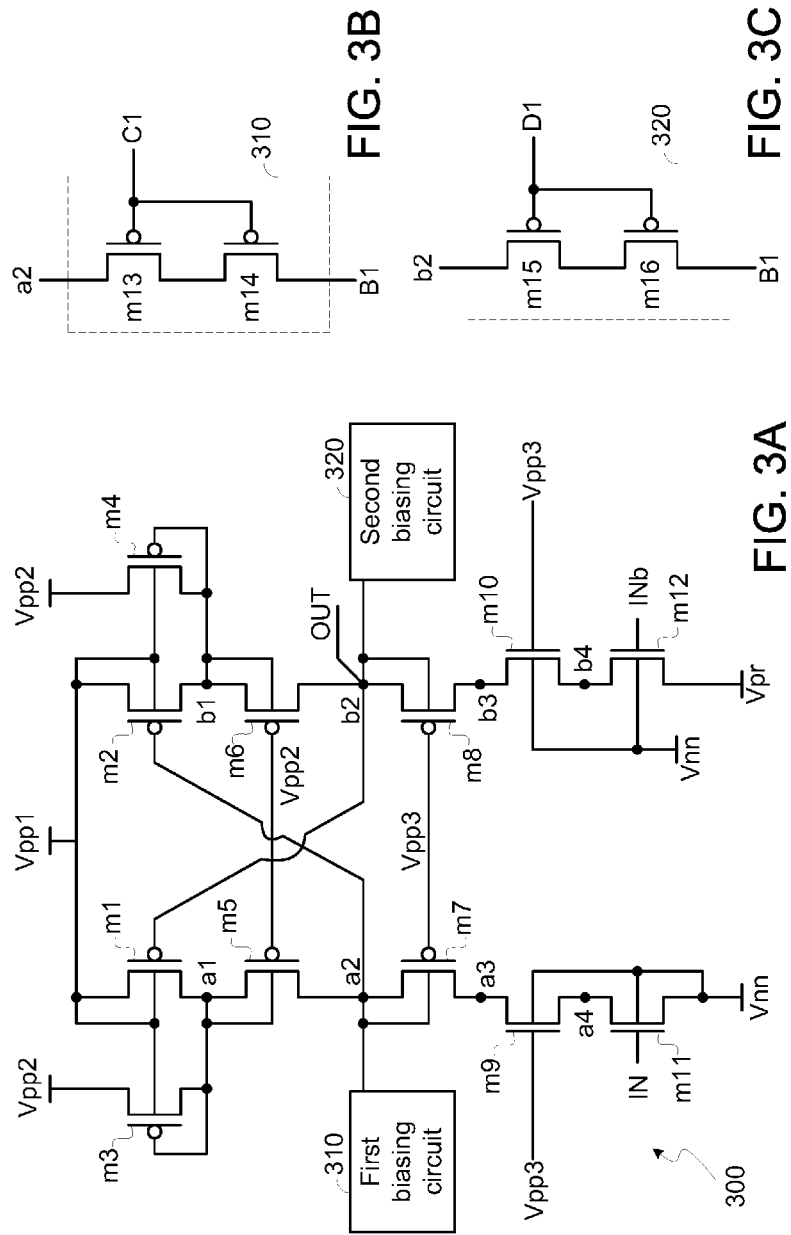

| IN/INb | a2 | b2(OUT) | M1 | M2 | x1 | x2 | OUT1 | OUT2 |
|---|---|---|---|---|---|---|---|---|
| Vdd/0 | Vpp3 | Vpp1 | Vpp1 | Vdd | Vpp2−|Vthp| | Vpp3 | Vpr | Vpp1 |
| Vdd/0 | Vpp3 | Vpp1 | 0 | 0 | Vpp1 | Vpp1 | Vpp1 | Vpp1 |
| 0/Vdd | Vpp1 | Vpp3 | Vpp1 | Vdd | Vpp2−|Vthp| | Vpp3 | Vpr | Vpr |
| 0/Vdd | Vpp1 | Vpp3 | 0 | 0 | Vpp2−|Vthp| | Vpp3 | Vpr | Vpr |

DRIVING CIRCUIT FOR NON-VOLATILE MEMORY

This application claims the benefit of U.S. provisional application Ser. No. 62/362,068, filed Jul. 14, 2016, the disclosure of which is incorporated by reference herein in its entirety.

FIELD OF THE INVENTION

The present invention relates to a driving circuit, and more particularly to a driving circuit for a non-volatile memory.

BACKGROUND OF THE INVENTION

As is well known, a non-volatile memory is able to continuously retain data after the supplied power is interrupted. Consequently, the non-volatile memory is widely used in a variety of electronic products. Generally, the non-volatile memory comprises a non-volatile cell array. The non-volatile cell array consists of plural non-volatile cells. In addition, each non-volatile cell has a floating gate transistor.

FIG. 1 schematically illustrates the architecture of a non-volatile memory. As shown in FIG. 1, the non-volatile memory comprises a non-volatile cell array 110 and a driving circuit 120. The driving circuit 120 is connected with the non-volatile cell array 110. The driving circuit 120 provides different driving signals OUT to the non-volatile cell array 110 in different operation modes of the non-volatile memory.

For example, the driving circuit 120 provides the suitable driving signal OUT to the non-volatile cell array 110 according to the operation mode of the non-volatile memory. According to the driving signal OUT, a read operation or a program operation of the non-volatile cell array 110 is performed.

SUMMARY OF THE INVENTION

The present invention provides a driving circuit for a non-volatile memory. The driving circuit is capable of stably providing a driving signal to a non-volatile cell array when the driving circuit is operated at a high temperature.

An embodiment of the present invention provides a driving circuit. The driving circuit includes a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a first biasing circuit and a second biasing circuit. A source terminal and a body terminal of the first transistor are connected with a first supply voltage. A drain terminal of the first transistor is connected with a node a1. A gate terminal of the first transistor is connected with a node b2. A source terminal and a body terminal of the second transistor are connected with the first supply voltage. A drain terminal of the second transistor is connected with a node b1. A gate terminal of the second transistor is connected with a node a2. A source terminal of the third transistor is connected with a second supply voltage. A body terminal of the third transistor is connected with the first supply voltage. A drain terminal and a gate terminal of the third transistor are connected with the node a1. A source terminal of the fourth transistor is connected with the second supply voltage. A body terminal of the fourth transistor is connected with the first supply voltage. A drain terminal and a gate terminal of the fourth transistor are connected with the node b1. A source terminal and a body terminal of the fifth transistor are connected with the node a1. A gate terminal of the fifth transistor is connected with the second supply voltage. A drain terminal of the fifth transistor is connected with the node a2. A source terminal and a body terminal of the sixth transistor are connected with the node b1. A gate terminal of the sixth transistor is connected with the second supply voltage. A drain terminal of the sixth transistor is connected with the node b2, wherein a driving signal is outputted from the node b2. A source terminal and a body terminal of the seventh transistor are connected with the node a2. A gate terminal of the seventh transistor is connected with a third supply voltage. A drain terminal of the seventh transistor is connected with a node a3. A source terminal and a body terminal of the eighth transistor are connected with the node b2. A gate terminal of the eighth transistor is connected with the third supply voltage. A drain terminal of the eighth transistor is connected with a node b3. A drain terminal of the ninth transistor is connected with the node a3. A gate terminal of the ninth transistor is connected with the third supply voltage. A source terminal of the ninth transistor is connected with a node a4. A body terminal of the ninth transistor is connected with a fourth supply voltage. A drain terminal of the tenth transistor is connected with the node b3. A gate terminal of the tenth transistor is connected with the third supply voltage. A source terminal of the tenth transistor is connected with a node b4. A body terminal of the tenth transistor is connected with the fourth supply voltage. A drain terminal of the eleventh transistor is connected with the node a4. A gate terminal of the eleventh transistor receives an input signal. A source terminal and a body terminal of the eleventh transistor are connected with the fourth supply voltage. A drain terminal of the twelfth transistor is connected with the node b4. A gate terminal of the twelfth transistor receives an inverted input signal. A source terminal of the twelfth transistor is connected with a fifth supply voltage. A body terminal of the twelfth transistor is connected with the fourth supply voltage. The first biasing circuit is connected with the node a2, and provides a specified voltage to the node a2. The second biasing circuit is connected with the node b2, and provides the specified voltage to the node b2.

Another embodiment of the present invention provides a driving circuit. The driving circuit includes a first driver, a switching circuit and a second driver. The first driver includes a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a first biasing circuit and a second biasing circuit. A source terminal and a body terminal of the first transistor are connected with a first supply voltage. A drain terminal of the first transistor is connected with a node a1. A gate terminal of the first transistor is connected with a node b2. A source terminal and a body terminal of the second transistor are connected with the first supply voltage. A drain terminal of the second transistor is connected with a node b1. A gate terminal of the second transistor is connected with a node a2. A source terminal of the third transistor is connected with a second supply voltage. A body terminal of the third transistor is connected with the first supply voltage. A drain terminal and a gate terminal of the third transistor are connected with the node a1. A source terminal of the fourth transistor is connected with the second supply voltage. A body terminal of the fourth transistor is connected with the first supply voltage. A drain terminal and a gate terminal of the fourth transistor are connected with the node b1. A source terminal and a body terminal of the fifth transistor are connected with the node a1. A gate terminal of the fifth transistor is connected with the second supply voltage. A drain terminal of the fifth transistor is connected with the node a2. A source terminal and a body terminal of the sixth transistor are connected with the node b1. A gate terminal of the sixth transistor is connected with the second supply voltage. A drain terminal of the sixth transistor is connected with the node b2. A source terminal and a body terminal of the seventh transistor are connected with the node a2. A gate terminal of the seventh transistor is connected with a third supply voltage. A drain terminal of the seventh transistor is connected with a node a3. A source terminal and a body terminal of the eighth transistor are connected with the node b2. A gate terminal of the eighth transistor is connected with the third supply voltage. A drain terminal of the eighth transistor is connected with a node b3. A drain terminal of the ninth transistor is connected with the node a3. A gate terminal of the ninth transistor is connected with the third supply voltage. A source terminal of the ninth transistor is connected with a node a4. A body terminal of the ninth transistor is connected with a fourth supply voltage. A drain terminal of the tenth transistor is connected with the node b3. A gate terminal of the tenth transistor is connected with the third supply voltage. A source terminal of the tenth transistor is connected with a node b4. A body terminal of the tenth transistor is connected with the fourth supply voltage. A drain terminal of the eleventh transistor is connected with the node a4. A gate terminal of the eleventh transistor receives an input signal. A source terminal and a body terminal of the eleventh transistor are connected with the fourth supply voltage. A drain terminal of the twelfth transistor is connected with the node b4. A gate terminal of the twelfth transistor receives an inverted input signal. A source terminal of the twelfth transistor is connected with a fifth supply voltage. A body terminal of the twelfth transistor is connected with the fourth supply voltage. The first biasing circuit is connected with the node a2, and provides a specified voltage to the node a2. The second biasing circuit is connected with the node b2, and provides the specified voltage to the node b2. The switching circuit is connected between the node b2 and an output terminal. The second driver is connected with the output terminal, wherein an output signal is outputted from the output terminal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3A is a schematic circuit diagram illustrating a driving circuit for a non-volatile memory according to a second embodiment of the present invention;

FIG. 3B is a schematic circuit diagram illustrating the first biasing circuit of the driving circuit according to the second embodiment of the present invention;

FIG. 3C is a schematic circuit diagram illustrating the second biasing circuit of the driving circuit according to the second embodiment of the present invention;

DETAILED DESCRIPTION OF PREFERRED EMBODIMENTS

Figure 1:
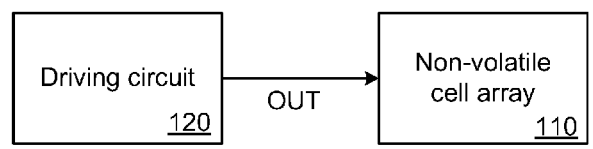
FIG. 1 (prior art) schematically illustrates the architecture of a non-volatile memory.
Figure 2:
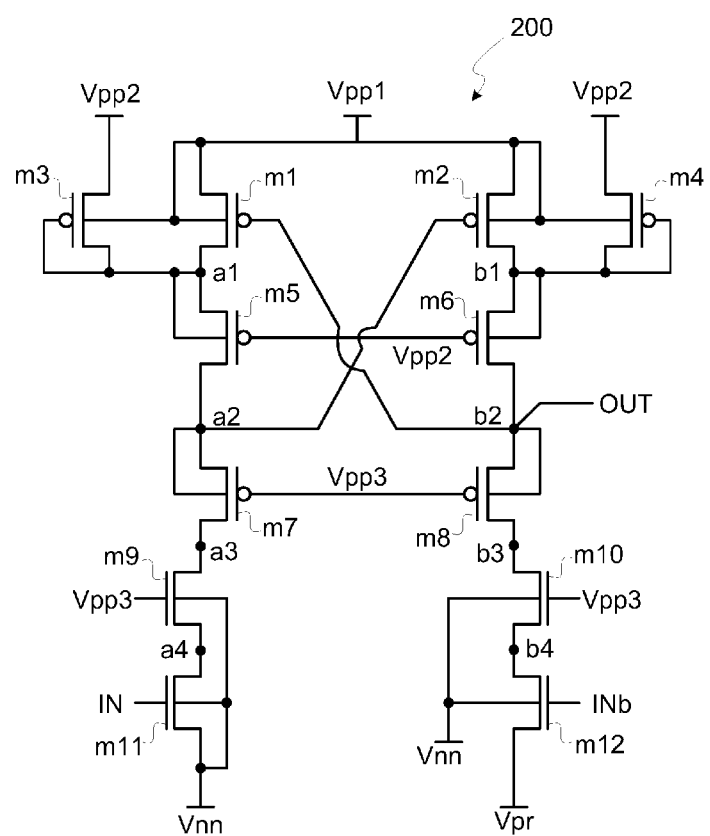
FIG. 2 is a schematic circuit diagram illustrating a driving circuit for a non-volatile memory according to a first embodiment of the present invention.

FIG. 2 is a schematic circuit diagram illustrating a driving circuit for a non-volatile memory according to a first embodiment of the present invention. The driving circuit 200 provides a driving signal OUT to a non-volatile cell array (not shown).

As shown in FIG. 2, the driving circuit 200 comprises plural p-type transistors m1~m8 and plural n-type transistors m9~m12. The body terminals of the transistors m1~m4 are connected with a first supply voltage Vpp1. The body terminals of the transistors m9~m12 are connected with a fourth supply voltage Vnn. The first supply voltage Vpp1 is the supply voltage with the highest voltage value. The fourth supply voltage Vnn is the supply voltage with the lowest voltage value.

The source terminal of the transistor m1 is connected with the first supply voltage Vpp1. The gate terminal of the transistor m1 is connected with a node b2. The drain terminal of the transistor m1 is connected with a node a1. The source terminal of the transistor m2 is connected with the first supply voltage Vpp1. The gate terminal of the transistor m2 is connected with a node a2. The drain terminal of the transistor m2 is connected with a node b1. The source terminal of the transistor m3 is connected with a second supply voltage Vpp2. The gate terminal and the drain terminal of the transistor m3 are connected with the node a1. The source terminal of the transistor m4 is connected with the second supply voltage Vpp2. The gate terminal and the drain terminal of the transistor m4 are connected with a node b1. The source terminal and the body terminal of the transistor m5 are connected with the node a1. The gate terminal of the transistor m5 is connected with the second supply voltage Vpp2. The drain terminal of the transistor m5 is connected with the node a2. The source terminal and the body terminal of the transistor m6 are connected with the node b1. The gate terminal of the transistor m6 is connected with the second supply voltage Vpp2. The drain terminal of the transistor m6 is connected with the node b2. The second supply voltage Vpp2 is lower than or equal to the first supply voltage Vpp1. Moreover, the driving signal OUT is outputted from the node b2.

The source terminal and the body terminal of the transistor m7 are connected with the node a2. The gate terminal of the transistor m7 is connected with a third supply voltage Vpp3. The drain terminal of the transistor m7 is connected with a node a3. The source terminal and the body terminal of the transistor m8 are connected with the node b2. The gate terminal of the transistor m8 is connected with the third supply voltage Vpp3. The drain terminal of the transistor m8 is connected with a node b3. The third supply voltage Vpp3 is lower than or equal to the second supply voltage Vpp2.

The drain terminal of the transistor m9 is connected with the node a3. The gate terminal of the transistor m9 is connected with the third supply voltage Vpp3. The source terminal of the transistor m9 is connected with a node a4. The drain terminal of the transistor m10 is connected with the node b3. The gate terminal of the transistor m10 is connected with the third supply voltage Vpp3. The source terminal of the transistor m10 is connected with a node b4. The drain terminal of the transistor m11 is connected with the node a4. The gate terminal of the transistor m11 receives an input signal IN. The source terminal of the transistor m11 is connected with the fourth supply voltage Vnn. The drain terminal of the transistor m12 is connected with the node b4. The gate terminal of the transistor m12 receives an inverted input signal INb. The source terminal of the transistor m12 is connected with a fifth supply voltage Vpr. Moreover, the fifth supply voltage Vpr is lower than or equal to the third supply voltage Vpp3, and the fifth supply voltage Vpr is higher than or equal to the fourth supply voltage Vnn.

The first supply voltage Vpp1 is a program voltage of the non-volatile memory. The fifth supply voltage Vpr is a read voltage of the non-volatile memory. In an embodiment, the first supply voltage Vpp1 is 9V, the second supply voltage Vpp2 is 6V, the third supply voltage Vpp3 is 4.5V, the fourth supply voltage Vnn is 0V, and the fifth supply voltage Vpr is 1.5V.

When the driving circuit 200 of the first embodiment is operated at a high temperature (e.g., 150° C.~250°), the node a2 or the node b2 is possibly in a floating state. For example, in case that the node b2 is in the floating state, the voltage difference between the source terminal and the drain terminal of the transistor m6 is possibly beyond a safe operation area (SOA), and the voltage difference between the source terminal and the drain terminal of the transistor m1 is possibly beyond the safe operation area. Moreover, if the transistor m1 or m6 is beyond the safe operation area, the magnitude of the leakage current increases. Under this circumstance, the magnitudes of the supply voltages and the driving signal OUT are adversely affected, and the non-volatile cell array cannot be normally operated.

FIG. 3A is a schematic circuit diagram illustrating a driving circuit for a non-volatile memory according to a second embodiment of the present invention. In comparison with the first embodiment, a first biasing circuit 310 and a second biasing circuit 320 are added in the second embodiment. In the driving circuit 300 of this embodiment, the node a2 and the node b2 are respectively connected with the first biasing circuit 310 and the second biasing circuit 320. The first biasing circuit 310 provides a specified voltage to the node a2. Consequently, the node a2 is not in the floating state. Similarly, the second biasing circuit 320 provides the specified voltage to the node b2. Consequently, the node b2 is not in the floating state.

FIG. 3B is a schematic circuit diagram illustrating the first biasing circuit of the driving circuit according to the second embodiment of the present invention. FIG. 3C is a schematic circuit diagram illustrating the second biasing circuit of the driving circuit according to the second embodiment of the present invention.

As shown in FIG. 3B, the first biasing circuit 310 comprises p-type transistors m13 and m14. The source terminal of the transistor m13 is connected with the node a2. The gate terminal of the transistor m13 receives a control signal C1. The source terminal of the transistor m14 is connected with the drain terminal of the transistor m13. The gate terminal of the transistor m14 receives the control signal C1. The drain terminal of the transistor m14 receives a specified voltage B1. In an embodiment, the control signal C1 is the voltage at the node a3, and the specified voltage B1 is the third supply voltage Vpp3. That is, the gate terminal of the transistor m13 and the gate terminal of the transistor m14 are connected with the node a3, and the drain terminal of the transistor m14 is connected with the gate terminal of the transistor m9. Consequently, the first biasing circuit 310 can provide the third supply voltage Vpp3 to the node a2.

The second biasing circuit 320 comprises p-type transistors m15 and m16. The source terminal of the transistor m15 is connected with the node b2. The gate terminal of the transistor m15 receives a control signal D1. The source terminal of the transistor m16 is connected with the drain terminal of the transistor m15. The gate terminal of the transistor m16 receives the control signal D1. The drain terminal of the transistor m16 receives the specified voltage B1. In an embodiment, the control signal D1 is the voltage at the node b3, and the specified voltage B1 is the third supply voltage Vpp3. That is, the gate terminal of the transistor m15 and the gate terminal of the transistor m16 are connected with the node b3, and the drain terminal of the transistor m16 is connected with the gate terminal of the transistor m10. Consequently, the second biasing circuit 320 can provide the third supply voltage Vpp3 to the node b2.

Optionally, the body terminal and the source terminal of the transistor m13 are connected with each other, the body terminal and the source terminal of the transistor m14 are connected with each other, the body terminal and the source terminal of the transistor m15 are connected with each other, and the body terminal and the source terminal of the transistor m16 are connected with each other. Alternatively, the body terminals of the transistors m13~m16 are connected with the first supply voltage Vpp1 or any other bias voltage.

The reason why the node a2 is not in the floating state will be described as follows. When the input signal IN is in a high level state and the inverted input signal INb is in a low level state, the fourth supply voltage Vnn is provided to the node a3. That is, the control signal C1 is equal to the fourth supply voltage Vnn. Moreover, the first supply voltage Vpp1 is provided to the node b2 and the node b3. That is, the control signal D1 is equal to the first supply voltage Vpp1. Consequently, the second biasing circuit 320 is disabled. Since the control signal C1 is equal to the fourth supply voltage Vnn, the transistors m13 and m14 of the first biasing circuit 310 are turned on. Meanwhile, the first biasing circuit 310 is enabled and provides the third supply voltage Vpp3 to the node a2. In the high level state, the voltage level is equal to Vdd (e.g., 3.3V). In the low level state, the voltage level is equal to a ground voltage (e.g., 0V).

On the other hand, when the input signal IN is in the low level state and the inverted input signal INb is in the high level state, the first supply voltage Vpp1 is provided to the nodes a2 and a3 to disable the first biasing circuit 310. Furthermore, the fifth supply voltage Vpr is provided to the node b3 to enable the second biasing circuit 320. The second biasing circuit 320 provides the third supply voltage Vpp3 to the node b2.

Due to the architecture of the driving circuit 300 of the second embodiment, the node a2 is not in the floating state. Similarly, due to the architecture of the driving circuit 300 of the second embodiment, the node b2 is not in the floating state.

Figure 4A:
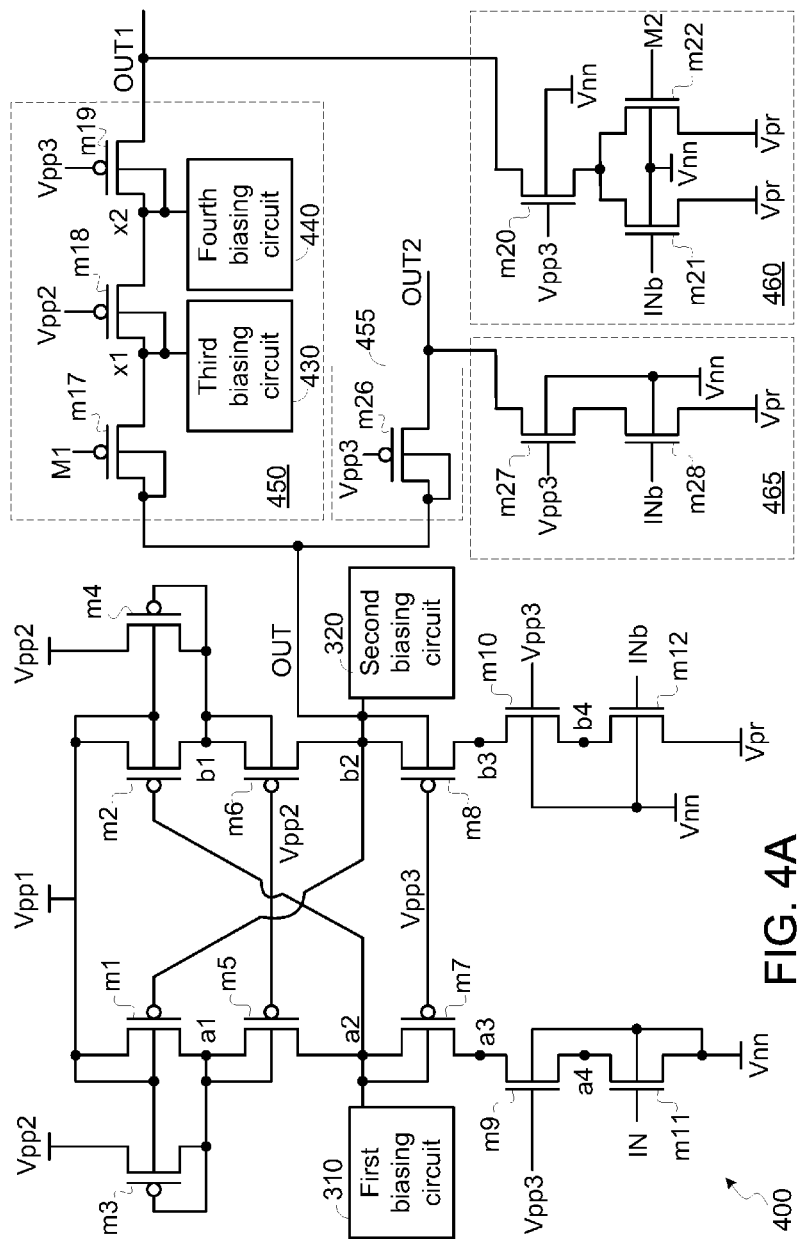
FIG. 4A is a schematic circuit diagram illustrating a driving circuit for a non-volatile memory according to a third embodiment of the present invention.

FIG. 4A is a schematic circuit diagram illustrating a driving circuit for a non-volatile memory according to a third embodiment of the present invention. As shown in FIG. 4A, the driving circuit comprises a first driver 400, a second driver 460, a third driver 465, a first switching circuit 450 and a second switching circuit 455. The circuitry of the first driver 400 is identical to the circuitry of the driving circuit 300 of the second embodiment, and is not redundantly described herein.

In comparison with the second embodiment, the driving circuit of this embodiment further comprises the first switching circuit 450, the second switching circuit 455, the second driver 460 and the third driver 465. The first switching circuit 450 is connected between the node b2 and a first output terminal, and the first output terminal generates a first output signal OUT1. The second switching circuit 455 is connected between the node b2 and a second output terminal, and the second output terminal generates a second output signal OUT2. The second driver 460 is connected with the first output terminal. The third driver 465 is connected with the second output terminal.

In the first switching circuit 450, the transistors m17, m18 and m19 are used as switch elements. The source terminal of the transistor m17 receives the driving signal OUT. The body terminal of the transistor m17 is connected with the source terminal of the of the transistor m17. The gate terminal of the transistor m17 receives a mode signal M1. The drain terminal of the transistor m17 is connected with a node x1. The source terminal of the transistor m18 is connected with the node x1. The body terminal of the transistor m18 is connected with the source terminal of the transistor m18. The gate terminal of the transistor m18 receives the second supply voltage Vpp2. The drain terminal of the transistor m18 is connected with a node x2. The source terminal of the transistor m19 is connected with the node x2. The body terminal of the transistor m19 is connected with a source terminal of the transistor m19. The gate terminal of the transistor m19 receives the third supply voltage Vpp3. The drain terminal of the transistor m19 is connected with the first output terminal to generate the first output signal OUT1.

The second driver 460 comprises n-type transistors m20~m22. The body terminals of transistors m20~m22 are connected with the fourth supply voltage Vnn. The drain terminal of the transistor m20 is connected with the first output terminal. The gate terminal of the transistor m20 receives the third supply voltage Vpp3. The drain terminal of the transistor m21 is connected with the source terminal of the transistor m20. The gate terminal of the transistor m21 receives the inverted input signal INb. The source terminal of the transistor m21 is connected with the fifth supply voltage Vpr. The drain terminal of the transistor m22 is connected with the source terminal of the transistor m20. The gate terminal of the transistor m22 receives a mode signal M2. The source terminal of the transistor m22 is connected with the fifth supply voltage Vpr.

The switching circuit 450 further comprises a third biasing circuit 430 and a fourth biasing circuit 440. By the third biasing circuit 430 and the fourth biasing circuit 440, the node x1 and the node x2 are not in the floating state during the operation of the driving circuit. The third biasing circuit 430 is connected with the node x1. The fourth biasing circuit 440 is connected with the node x2.

In the second switching circuit 455, the transistor m26 is used as switch element. The source terminal of the transistor m26 receives the driving signal OUT. The body terminal of the transistor m26 is connected with the source terminal of the of the transistor m26. The gate terminal of the transistor m26 receives the third supply voltage Vpp3. The drain terminal of the transistor m26 is connected with the second output terminal to generate the second output signal OUT2.

The third driver 465 comprises n-type transistors m27 and 28. The body terminals of transistors m27 and 28 are connected with the fourth supply voltage Vnn. The drain terminal of the transistor m27 is connected with the second output terminal. The gate terminal of the transistor m27 receives the third supply voltage Vpp3. The drain terminal of the transistor m28 is connected with the source terminal of the transistor m27. The gate terminal of the transistor m28 receives the inverted input signal INb. The source terminal of the transistor m28 is connected with the fifth supply voltage Vpr.

Figures 4B, 4C, 4D:
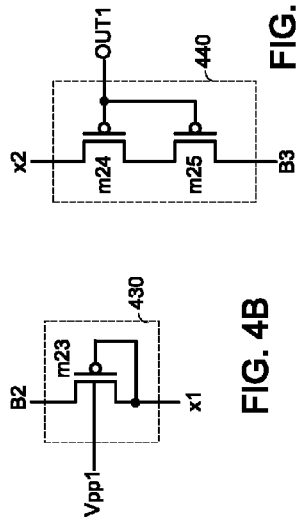
FIG. 4B is a schematic circuit diagram illustrating the third biasing circuit of the driving circuit according to the third embodiment of the present invention.
FIG. 4C is a schematic circuit diagram illustrating the fourth biasing circuit of the driving circuit according to the third embodiment of the present invention.
FIG. 4D is a table illustrating the voltage levels of associated signals when the driving circuit of the third embodiment is operated in different operation modes.

FIG. 4B is a schematic circuit diagram illustrating the third biasing circuit of the driving circuit according to the third embodiment of the present invention. FIG. 4C is a schematic circuit diagram illustrating the fourth biasing circuit of the driving circuit according to the third embodiment of the present invention.

The third biasing circuit 430 comprises a p-type transistor m23. The source terminal of the transistor m23 receives a specified voltage B2. The gate terminal and the drain terminal of the transistor m23 are connected with the node x1. The body terminal of the transistor m23 is connected with the first supply voltage Vpp1. In an embodiment, the specified voltage B2 is equal to the second supply voltage Vpp2. Consequently, the voltage provided from the third biasing circuit 430 to the node x1 is equal to (Vpp2−|Vthp|), wherein Vthp is a threshold voltage of the transistor m23.

The fourth biasing circuit 440 comprises p-type transistors m24 and m25. The source terminal of the transistor m24 is connected with the node x2. The gate terminal of the transistor m24 receives the first output signal OUT1. The source terminal of the transistor m25 is connected with the drain terminal of the transistor m24. The gate terminal of the transistor m25 receives the first output signal OUT1. The drain terminal of the transistor m25 receives a specified voltage B3. In an embodiment, the specified voltage B3 is the third supply voltage Vpp3. Consequently, the fourth biasing circuit 440 can provide the third supply voltage Vpp3 to the node x2.

FIG. 4D is a table illustrating the voltage levels of associated signals when the driving circuit of the third embodiment is operated in different operation modes.

In a first operation mode, the mode signal M1 is equal to Vpp1, and the mode signal M2 is equal to Vdd. In a second operation mode, the mode signals M1 and M2 are 0V, but M1 can also be the third supply voltage Vpp3 to reduce stress of the transistor m17 and keep the same function.

In a first situation, the driving circuit is in the first operation mode, and the input signal IN is equal to Vdd and the inverted input signal INb is 0V. Under this circumstance, the voltage provided to the node a2 is equal to the third supply voltage Vpp3, the voltage provided to the node b2 is equal to the first supply voltage Vpp1, the voltage provided to the node x1 is equal to (Vpp2−|Vthp|), the voltage provided to the node x2 is equal to the third supply voltage Vpp3, the first output signal OUT1 is equal to the fifth supply voltage Vpr, and the second output signal OUT2 is equal to the first supply voltage Vpp1.

In a second situation, the driving circuit is in the second operation mode, and the input signal IN is equal to Vdd and the inverted input signal INb is 0V. Under this circumstance, the voltage provided to the node a2 is equal to the third supply voltage Vpp3, the voltage provided to the node b2 is equal to the first supply voltage Vpp1, the voltage provided to the node x1 is equal to the first supply voltage Vpp1, the voltage provided to the node x2 is equal to the first supply voltage Vpp1, the first output signal OUT1 is equal to the first supply voltage Vpp1, and the second output signal OUT2 is equal to the first supply voltage Vpp1.

In a third situation, the driving circuit is in the first operation mode, and the input signal IN is 0V and the inverted input signal INb is equal to Vdd. Under this circumstance, the voltage provided to the node a2 is equal to the first supply voltage Vpp1, the voltage provided to the node b2 is equal to the third supply voltage Vpp3, the voltage provided to the node x1 is equal to (Vpp2−|Vthp|), the voltage provided to the node x2 is equal to the third supply voltage Vpp3, the first output signal OUT1 is equal to the fifth supply voltage Vpr, and the second output signal OUT2 is equal to the fifth supply voltage Vpr.

In a fourth situation, the driving circuit is in the second operation mode, and the input signal IN is 0V and the inverted input signal INb is equal to Vdd. Under this circumstance, the voltage provided to the node a2 is equal to the first supply voltage Vpp1, the voltage provided to the node b2 is equal to the third supply voltage Vpp3, the voltage provided to the node x1 is equal to (Vpp2−|Vthp|), the voltage provided to the node x2 is equal to the third supply voltage Vpp3, the first output signal OUT1 is equal to the fifth supply voltage Vpr, and the second output signal OUT2 is equal to the fifth supply voltage Vpr.

From the above descriptions, the driving circuit of the second embodiment and the driving circuit of the third embodiment are capable of preventing the floating state of the nodes. Consequently, even if the driving circuit of the second embodiment and the driving circuit of the third embodiment are operated at a high temperature, the non-volatile cell array can be normally operated.

Furthermore, those skilled in the art will readily observe that numerous modifications and alterations may be made while retaining the teachings of the invention. For example, the driving circuit only generates the first output signal OUT1 and does not generate the second output signal OUT2. In another embodiment, the driving circuit may comprise the first driver, the second driver, and the first switching circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A driving circuit connected with a non-volatile cell array, the driving circuit comprising:

a first transistor, wherein a source terminal and a body terminal of the first transistor are connected with a first supply voltage, a drain terminal of the first transistor is connected with a node a1, and a gate terminal of the first transistor is connected with a node b2;

a second transistor, wherein a source terminal and a body terminal of the second transistor are connected with the first supply voltage, a drain terminal of the second transistor is connected with a node b1, and a gate terminal of the second transistor is connected with a node a2;

a third transistor, wherein a source terminal of the third transistor is connected with a second supply voltage, a body terminal of the third transistor is connected with the first supply voltage, and a drain terminal and a gate terminal of the third transistor are connected with the node a1;

a fourth transistor, wherein a source terminal of the fourth transistor is connected with the second supply voltage, a body terminal of the fourth transistor is connected with the first supply voltage, and a drain terminal and a gate terminal of the fourth transistor are connected with the node b1;

a fifth transistor, wherein a source terminal and a body terminal of the fifth transistor are connected with the node a1, a gate terminal of the fifth transistor is connected with the second supply voltage, and a drain terminal of the fifth transistor is connected with the node a2;

a sixth transistor, wherein a source terminal and a body terminal of the sixth transistor are connected with the node b1, a gate terminal of the sixth transistor is connected with the second supply voltage, and a drain terminal of the sixth transistor is connected with the node b2, wherein a driving signal is outputted from the node b2;

a seventh transistor, wherein a source terminal and a body terminal of the seventh transistor are connected with the node a2, a gate terminal of the seventh transistor is connected with a third supply voltage, and a drain terminal of the seventh transistor is connected with a node a3;

an eighth transistor, wherein a source terminal and a body terminal of the eighth transistor are connected with the node b2, a gate terminal of the eighth transistor is connected with the third supply voltage, and a drain terminal of the eighth transistor is connected with a node b3;

a ninth transistor, wherein a drain terminal of the ninth transistor is connected with the node a3, a gate terminal of the ninth transistor is connected with the third supply voltage, a source terminal of the ninth transistor is connected with a node a4, and a body terminal of the ninth transistor is connected with a fourth supply voltage;

a tenth transistor, wherein a drain terminal of the tenth transistor is connected with the node b3, a gate terminal of the tenth transistor is connected with the third supply voltage, a source terminal of the tenth transistor is connected with a node b4, and a body terminal of the tenth transistor is connected with the fourth supply voltage;

an eleventh transistor, wherein a drain terminal of the eleventh transistor is connected with the node a4, a gate terminal of the eleventh transistor receives an input signal, and a source terminal and a body terminal of the eleventh transistor are connected with the fourth supply voltage;

a twelfth transistor, wherein a drain terminal of the twelfth transistor is connected with the node b4, a gate terminal of the twelfth transistor receives an inverted input signal, a source terminal of the twelfth transistor is connected with a fifth supply voltage, and a body terminal of the twelfth transistor is connected with the fourth supply voltage;
a first biasing circuit connected with the node a2, and providing a specified voltage to the node a2; and
a second biasing circuit connected with the node b2, and providing the specified voltage to the node b2.

2. The driving circuit as claimed in claim 1, wherein the first biasing circuit comprises:
a thirteenth transistor, wherein a gate terminal of the thirteenth transistor is connected with the node a3, and a source terminal of the thirteenth transistor is connected with the node a2; and
a fourteenth transistor, wherein a source terminal of the fourteenth transistor is connected with a drain terminal of the thirteenth transistor, a gate terminal of the fourteenth transistor is connected with the node a3, and a drain terminal of the fourteenth transistor is connected with the third supply voltage.

3. The driving circuit as claimed in claim 2, wherein the second biasing circuit comprises:
a fifteenth transistor, wherein a gate terminal of the fifteenth transistor is connected with the node b3, and a source terminal of the fifteenth transistor is connected with the node b2; and
a sixteenth transistor, wherein a source terminal of the sixteenth transistor is connected with a drain terminal of the fifteenth transistor, a gate terminal of the sixteenth transistor is connected with the node b3, and a drain terminal of the sixteenth transistor is connected with the third supply voltage.

4. The driving circuit as claimed in claim 3, wherein a body terminal and a source terminal of the thirteenth transistor are connected with each other, a body terminal and a source terminal of the fourteenth transistor are connected with each other, a body terminal and a source terminal of the fifteenth transistor are connected with each other, and a body terminal and a source terminal of the sixteenth transistor are connected with each other.

5. The driving circuit as claimed in claim 3, wherein a body terminal of the thirteenth transistor, a body terminal of the fourteenth transistor, a body terminal of the fifteenth transistor and a body terminal of the sixteenth transistor are connected with a bias voltage.

6. The driving circuit as claimed in claim 1, wherein the first supply voltage is higher than or equal to the second supply voltage, the second supply voltage is higher than or equal to the third supply voltage, and the third supply voltage is higher than the fourth supply voltage.

7. A driving circuit connected with a non-volatile cell array, the driving circuit comprising:
a first driver comprising:
a first transistor, wherein a source terminal and a body terminal of the first transistor are connected with a first supply voltage, a drain terminal of the first transistor is connected with a node a1, and a gate terminal of the first transistor is connected with a node b2;
a second transistor, wherein a source terminal and a body terminal of the second transistor are connected with the first supply voltage, a drain terminal of the second transistor is connected with a node b1, and a gate terminal of the second transistor is connected with a node a2;
a third transistor, wherein a source terminal of the third transistor is connected with a second supply voltage, a body terminal of the third transistor is connected with the first supply voltage, and a drain terminal and a gate terminal of the third transistor are connected with the node a1;
a fourth transistor, wherein a source terminal of the fourth transistor is connected with the second supply voltage, a body terminal of the fourth transistor is connected with the first supply voltage, and a drain terminal and a gate terminal of the fourth transistor are connected with the node b1;
a fifth transistor, wherein a source terminal and a body terminal of the fifth transistor are connected with the node a1, a gate terminal of the fifth transistor is connected with the second supply voltage, and a drain terminal of the fifth transistor is connected with the node a2;
a sixth transistor, wherein a source terminal and a body terminal of the sixth transistor are connected with the node b1, a gate terminal of the sixth transistor is connected with the second supply voltage, and a drain terminal of the sixth transistor is connected with the node b2;
a seventh transistor, wherein a source terminal and a body terminal of the seventh transistor are connected with the node a2, a gate terminal of the seventh transistor is connected with a third supply voltage, and a drain terminal of the seventh transistor is connected with a node a3;
an eighth transistor, wherein a source terminal and a body terminal of the eighth transistor are connected with the node b2, a gate terminal of the eighth transistor is connected with the third supply voltage, and a drain terminal of the eighth transistor is connected with a node b3;
a ninth transistor, wherein a drain terminal of the ninth transistor is connected with the node a3, a gate terminal of the ninth transistor is connected with the third supply voltage, a source terminal of the ninth transistor is connected with a node a4, and a body terminal of the ninth transistor is connected with a fourth supply voltage;
a tenth transistor, wherein a drain terminal of the tenth transistor is connected with the node b3, a gate terminal of the tenth transistor is connected with the third supply voltage, a source terminal of the tenth transistor is connected with a node b4, and a body terminal of the tenth transistor is connected with the fourth supply voltage;
an eleventh transistor, wherein a drain terminal of the eleventh transistor is connected with the node a4, a gate terminal of the eleventh transistor receives an input signal, and a source terminal and a body terminal of the eleventh transistor are connected with the fourth supply voltage;
a twelfth transistor, wherein a drain terminal of the twelfth transistor is connected with the node b4, a gate terminal of the twelfth transistor receives an inverted input signal, a source terminal of the twelfth transistor is connected with a fifth supply voltage, and a body terminal of the twelfth transistor is connected with the fourth supply voltage;
a first biasing circuit connected with the node a2, and providing a specified voltage to the node a2; and
a second biasing circuit connected with the node b2, and providing the specified voltage to the node b2;
a first switching circuit connected between the node b2 and a first output terminal; and a second driver connected with the first output terminal, wherein a first output signal is outputted from the first output terminal.

8. The driving circuit as claimed in claim 7, wherein the first biasing circuit comprises:
   a thirteenth transistor, wherein a gate terminal of the thirteenth transistor is connected with the node a3, and a source terminal of the thirteenth transistor is connected with the node a2; and
   a fourteenth transistor, wherein a source terminal of the fourteenth transistor is connected with a drain terminal of the thirteenth transistor, a gate terminal of the fourteenth transistor is connected with the node a3, and a drain terminal of the fourteenth transistor is connected with the third supply voltage.

9. The driving circuit as claimed in claim 8, wherein the second biasing circuit comprises:
   a fifteenth transistor, wherein a gate terminal of the fifteenth transistor is connected with the node b3, and a source terminal of the fifteenth transistor is connected with the node b2; and
   a sixteenth transistor, wherein a source terminal of the sixteenth transistor is connected with a drain terminal of the fifteenth transistor, a gate terminal of the sixteenth transistor is connected with the node b3, and a drain terminal of the sixteenth transistor is connected with the third supply voltage.

10. The driving circuit as claimed in claim 9, wherein a body terminal and a source terminal of the thirteenth transistor are connected with each other, a body terminal and a source terminal of the fourteenth transistor are connected with each other, a body terminal and a source terminal of the fifteenth transistor are connected with each other, and a body terminal and a source terminal of the sixteenth transistor are connected with each other.

11. The driving circuit as claimed in claim 9, wherein a body terminal of the thirteenth transistor, a body terminal of the fourteenth transistor, a body terminal of the fifteenth transistor and a body terminal of the sixteenth transistor are connected with a bias voltage.

12. The driving circuit as claimed in claim 7, wherein the first supply voltage is higher than or equal to the second supply voltage, the second supply voltage is higher than or equal to the third supply voltage, and the third supply voltage is higher than the fourth supply voltage.

13. The driving circuit as claimed in claim 7, wherein the first switching circuit comprises:
   a seventeenth transistor, wherein a source terminal and a body terminal of the seventeenth transistor are connected with the node b2, a gate terminal of the seventeenth transistor receives a first mode signal, and a drain terminal of the seventeenth transistor is connected with a node x1;
   an eighteenth transistor, wherein a source terminal and a body terminal of the eighteenth transistor are connected with the node x1, a gate terminal of the eighteenth transistor is connected with the second supply voltage, and a drain terminal of the eighteenth transistor is connected with a node x2;
   a nineteenth transistor, wherein a source terminal and a body terminal of the nineteenth transistor are connected with the node x2, a gate terminal of the nineteenth transistor is connected with the third supply voltage, and a drain terminal of the nineteenth transistor is connected with the first output terminal;
   a third biasing circuit connected with the node x1; and
   a fourth biasing circuit connected with the node x2.

14. The driving circuit as claimed in claim 13, wherein the second driver comprises:
   a twentieth transistor, wherein a drain terminal of the twentieth transistor is connected with the first output terminal, a gate terminal of the twentieth transistor receives the third supply voltage, and a body terminal of the twentieth transistor receives the fourth supply voltage;
   a twenty-first transistor, wherein a drain terminal of the twenty-first transistor is connected with a source terminal of the twentieth transistor, a gate terminal of the twenty-first transistor receives the inverted input signal, a body terminal of the twenty-first transistor receives the fourth supply voltage, and a source terminal of the twenty-first transistor is connected with the fifth supply voltage; and
   a twenty-second transistor, wherein a drain terminal of the twenty-second transistor is connected with the source terminal of the twentieth transistor, a gate terminal of the twenty-second transistor receives a second mode signal, a body terminal of the twenty-second transistor receives the fourth supply voltage, and a source terminal of the twenty-second transistor is connected with the fifth supply voltage.

15. The driving circuit as claimed in claim 13, wherein the third biasing circuit comprises a twenty-third transistor, wherein a source terminal of the twenty-third transistor is connected with the second supply voltage, a gate terminal and a drain terminal of the twenty-third transistor are connected with the node x1, and a body terminal of the twenty-third transistor is connected with the first supply voltage.

16. The driving circuit as claimed in claim 15, wherein the fourth biasing circuit comprises:
   a twenty-fourth transistor, wherein a source terminal of the twenty-fourth transistor is connected with the node x2, and a gate terminal of the twenty-fourth transistor is connected with the first output terminal; and
   a twenty-fifth transistor, wherein a source terminal of the twenty-fifth transistor is connected with a drain terminal of the twenty-fourth transistor, a gate terminal of the twenty-fifth transistor is connected with the first output terminal, and a drain terminal of the twenty-fifth transistor is connected with the third supply voltage.

17. The driving circuit as claimed in claim 7, further comprising:
   a second switching circuit connected between the node b2 and a second output terminal; and
   a third driver connected with the second output terminal, wherein a second output signal is outputted from the second output terminal.

18. The driving circuit as claimed in claim 17, wherein the second switching circuit comprises:
   a twenty-sixth transistor, wherein a source terminal and a body terminal of the a twenty-sixth transistor are connected with the node b2, a gate terminal of the a twenty-sixth transistor receives the third supply voltage, and a drain terminal of the a twenty-sixth transistor is connected with the second output terminal.

19. The driving circuit as claimed in claim 17, wherein the third driver comprises:
   a twenty-seventh transistor, wherein a drain terminal of the twenty-seventh transistor is connected with the second output terminal, a gate terminal of the twenty-seventh transistor receives the third supply voltage, and a body terminal of the twenty-seventh transistor receives the fourth supply voltage; and a twenty-eighth transistor, wherein a drain terminal of the twenty-eighth transistor is connected with a source terminal of the twenty-seventh transistor, a gate terminal of the twenty-eighth transistor receives the inverted input signal, a body terminal of the twenty-eighth receives the fourth supply voltage, and a source terminal of the twenty-eighth transistor is connected with the fifth supply voltage.

* * * * *